(12) United States Patent
Yoshida et al.

(10) Patent No.: US 9,881,828 B2
(45) Date of Patent: Jan. 30, 2018

(54) WAFER PROCESSING METHOD

(71) Applicant: DISCO CORPORATION, Tokyo (JP)

(72) Inventors: Shinji Yoshida, Tokyo (JP); Yusaku Ito, Tokyo (JP); Hirohide Yano, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/410,886

(22) Filed: Jan. 20, 2017

(65) Prior Publication Data

US 2017/0213756 A1 Jul. 27, 2017

(30) Foreign Application Priority Data

Jan. 22, 2016 (JP) .................... 2016-010291

(51) Int. Cl.
| | | |
|---|---|---|
| *H01L 21/78* | (2006.01) | |
| *H01L 21/683* | (2006.01) | |
| *H01L 21/304* | (2006.01) | |
| *H01L 21/67* | (2006.01) | |
| *H01L 21/66* | (2006.01) | |

(52) U.S. Cl.
CPC .... *H01L 21/6836* (2013.01); *H01L 21/67253* (2013.01); *H01L 21/67288* (2013.01); *H01L 21/78* (2013.01); *H01L 22/20* (2013.01); *H01L 22/24* (2013.01); *H01L 2221/68327* (2013.01); *H01L 2221/68377* (2013.01); *H01L 2221/68381* (2013.01)

(58) Field of Classification Search
CPC .......... H01L 21/6836; H01L 21/67253; H01L 21/67288; H01L 21/78; H01L 22/20; H01L 22/24; H01L 2221/68327; H01L 2221/68377; H01L 2221/68381
See application file for complete search history.

(56) References Cited

U.S. PATENT DOCUMENTS

| | | | | |
|---|---|---|---|---|
| 7,507,639 | B2 * | 3/2009 | Nakamura | ......... B23K 26/0057 257/E21.599 |
| 7,767,551 | B2 * | 8/2010 | Arita | ....................... H01L 21/78 438/460 |
| 9,082,712 | B2 * | 7/2015 | Sekiya | .................. H01L 21/304 |
| 9,165,832 | B1 * | 10/2015 | Papanu | ................... H01L 21/78 |

(Continued)

FOREIGN PATENT DOCUMENTS

JP 2014-007332 1/2014

*Primary Examiner* — Marvin Payen
*Assistant Examiner* — Jeremy Joy
(74) *Attorney, Agent, or Firm* — Greer Burns & Crain Ltd.

(57) ABSTRACT

Disclosed herein is a wafer processing method including the steps of attaching a dicing tape to the back side of a wafer, the dicing tape being composed of a base tape, a DAF, and an adhesive layer for uniting the base tape and the DAF, imaging the wafer through the dicing tape to obtain an image of the wafer, detecting the positions of poor adhesion of the DAF from the image, storing the positions of poor adhesion detected above, dividing the wafer and the DAF into individual chips each having the DAF, curing the adhesive layer of the dicing tape by the application of ultraviolet light, selectively separating the chips with the DAF well adhered, at the boundary between the adhesive layer and the DAF according to the positions of poor adhesion stored above, and then picking up the chips with the DAF well adhered.

2 Claims, 10 Drawing Sheets

(56) References Cited

U.S. PATENT DOCUMENTS

| | | | | |
|---|---|---|---|---|
| 2001/0049160 A1* | 12/2001 | Watanabe | ......... | H01L 21/67132 |
| | | | | 438/113 |
| 2006/0024924 A1* | 2/2006 | Haji | .................... | H01L 21/6835 |
| | | | | 438/464 |
| 2006/0220183 A1* | 10/2006 | Asai | .................. | H01L 21/67132 |
| | | | | 257/622 |
| 2008/0063871 A1* | 3/2008 | Jung | ...................... | C09J 163/00 |
| | | | | 428/414 |
| 2009/0011525 A1* | 1/2009 | Yamamoto | ........ | H01L 21/67132 |
| | | | | 438/7 |
| 2010/0136766 A1* | 6/2010 | Sakamoto | .......... | B23K 26/0057 |
| | | | | 438/463 |
| 2011/0297300 A1* | 12/2011 | Furuya | ................... | C09J 183/04 |
| | | | | 156/154 |
| 2012/0329246 A1* | 12/2012 | Finn | ........................ | H01L 21/78 |
| | | | | 438/462 |
| 2013/0084658 A1* | 4/2013 | Vaupel | .................... | H01L 21/78 |
| | | | | 438/14 |
| 2014/0208850 A1* | 7/2014 | Kim | ....................... | G01N 29/14 |
| | | | | 73/587 |
| 2016/0293463 A1* | 10/2016 | Nishizaki | ................ | H01L 22/12 |

\* cited by examiner

WAFER PROCESSING METHOD

BACKGROUND OF THE INVENTION

Field of the Invention

The present invention relates to a wafer processing method for dividing a wafer into individual chips and attaching a die attach film (DAF) to the back side of each chip to form the chip with the DAF attached thereto.

Description of the Related Art

In die bonding, a chip obtained by dividing a wafer is bonded through an adhesive tape called DAF to a substrate or the like (see Japanese Patent Laid-open No. 2014-007332, for example). In recent years, there has been developed a tape formed by uniting a dicing tape and a DAF through an adhesive layer curable by the application of ultraviolet light. One side of the DAF of this tape is attached to the back side of a wafer, and this tape is used as a dicing tape in dividing the wafer. After dividing the wafer into individual chips by dicing, ultraviolet light is applied to this tape to thereby cure the adhesive layer, so that the DAF is separated from the dicing tape in the condition where the DAF remains attached to each chip. Thus, each chip with the DAF attached thereto is picked up from the dicing tape.

SUMMARY OF THE INVENTION

In the case that scratch or dust is present on the back side of any one of the chips, there is a possibility that bubbles may be left between the back side of the chip and the DAF, causing poor adhesion of the DAF to the chip. To cope with this problem, in conventional die bonding, it is checked whether or not the chip mounted on a substrate or the like is normally bonded through the DAF to the substrate. In this manner, the bonded condition of the chip is checked after mounting the chip to the substrate. Accordingly, if the poor adhesion of the DAF is recognized, the chip mounting operation and the chip mounted on the substrate become wasted.

It is therefore an object of the present invention to provide a wafer processing method which can eliminate mounting of the chips having the poor adhesion of the DAF, thereby improving the working efficiency.

In accordance with an aspect of the present invention, there is provided a wafer processing method for processing a wafer having a plurality of devices, the front side of the wafer being partitioned by a plurality of crossing division lines to thereby define a plurality of separate regions where the devices are formed, the wafer processing method including a tape attaching step of attaching a dicing tape to the back side of the wafer, the dicing tape having a DAF and an adhesive layer curable by the application of ultraviolet light; a storing step of imaging the wafer through the dicing tape to obtain an image of the wafer after performing the tape attaching step, detecting the positions of poor adhesion where the DAF does not adhere to the wafer, from the image, and storing the positions of poor adhesion detected above; a dividing step of dividing the wafer into individual chips along the division lines and also dividing the DAF into pieces attached to the respective chips after performing the storing step; an ultraviolet light applying step of applying ultraviolet light to the dicing tape after performing the dividing step, thereby curing the adhesive layer to reduce its adhesive force; and a pickup step of selectively separating the chips with the DAF well adhered, at the boundary between the adhesive layer and the DAF according to the positions of poor adhesion stored in the storing step, after performing the ultraviolet light applying step, and next picking up the chips with the DAF well adhered.

With this configuration, the dicing tape having the DAF and the adhesive layer is attached to the back side of the wafer, and the back side of the wafer is imaged through the dicing tape to detect the positions of poor adhesion where the DAF does not adhere to the wafer. The positions of poor adhesion detected above are stored. After dividing the wafer and the DAF, only the chips with the DAF well adhered are separated at the boundary between the DAF and the adhesive layer and then picked up. Accordingly, there is no possibility that the chips having the poor adhesion of the DAF may be mounted to a substrate or the like, so that a chip mounting operation and the chips mounted are not wasted but the working efficiency can be improved.

In accordance with another aspect of the present invention, there is provided a wafer processing method for processing a wafer having a plurality of devices, the front side of the wafer being partitioned by a plurality of crossing division lines to thereby define a plurality of separate regions where the devices are formed, the wafer processing method including a wafer dividing step of dividing the wafer into individual chips along the division lines; a tape attaching step of attaching an expansion tape to the back side of the wafer after performing the wafer dividing step, the expansion tape having a DAF and an adhesive layer curable by the application of ultraviolet light; a storing step of imaging the wafer through the expansion tape to obtain an image of the wafer after performing the tape attaching step, removing a breaking line formed between any adjacent ones of the chips, from the image, detecting the positions of poor adhesion where the DAF does not adhere to the wafer, from the image, and storing the positions of poor adhesion detected above; a DAF dividing step of dividing the DAF into pieces attached to the respective chips after performing the storing step; an ultraviolet light applying step of applying ultraviolet light to the expansion tape after performing the DAF dividing step, thereby curing the adhesive layer to reduce its adhesive force; and a pickup step of selectively separating the chips with the DAF well adhered, at the boundary between the adhesive layer and the DAF according to the positions of poor adhesion stored in the storing step, after performing the ultraviolet light applying step, and next picking up the chips with the DAF well adhered.

With this configuration, the expansion tape having the DAF and the adhesive layer is attached to the back side of the wafer after dividing the wafer, and the back side of the wafer is imaged through the expansion tape to remove each breaking line formed between any adjacent ones of the chips and also to detect the positions of poor adhesion where the DAF does not adhere to the wafer. The positions of poor adhesion detected above are stored. Accordingly, there is no possibility that each breaking line may be erroneously recognized as poor adhesion, so that only the positions of poor adhesion can be stored. After dividing the DAF, only the chips with the DAF well adhered are separated at the boundary between the DAF and the adhesive layer and then picked up. Accordingly, there is no possibility that the chips having the poor adhesion of the DAF may be mounted to a substrate or the like, so that a chip mounting operation and the chips mounted are not wasted, but the working efficiency can be improved.

According to the present invention, only the chips with the DAF well adhered can be selectively picked up according to the positions of poor adhesion of the DAF previously stored, so that mounting of the chips having the poor adhesion of the DAF can be eliminated to thereby improve the working efficiency.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
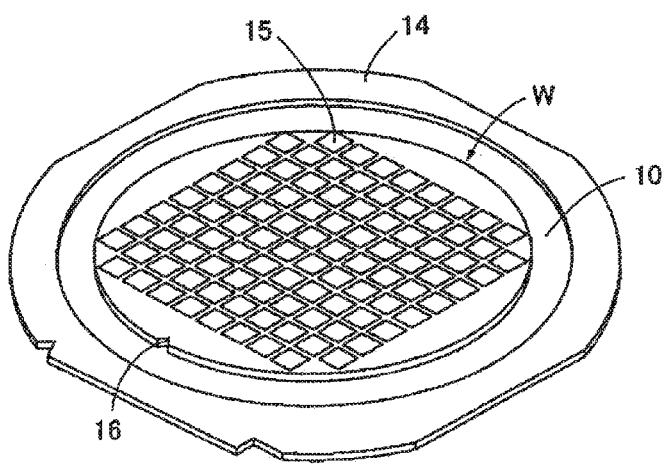
FIG. 1A is a perspective view of a wafer with a dicing tape attached thereto according to a first preferred embodiment of the present invention.
Figure 1B:
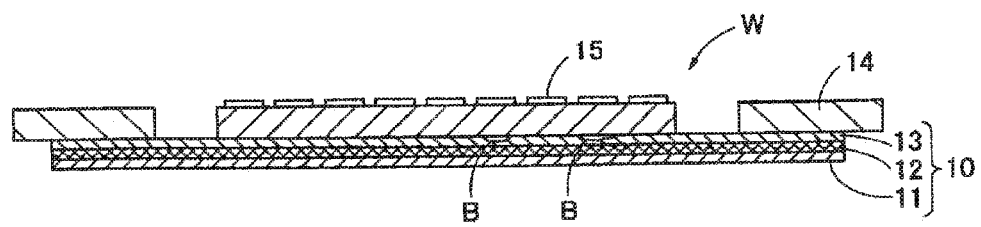
FIG. 1B is a sectional view of the wafer with the dicing tape shown in FIG. 1A.

A dicing tape with a DAF according to a first preferred embodiment of the present invention will now be described with reference to the attached drawings. FIG. 1A is a perspective view of a wafer W to which a dicing tape 10 is attached, and FIG. 1B is a schematic sectional view of the wafer W with the dicing tape 10 attached thereto. As shown in FIGS. 1A and 1B, the wafer W is a substantially disk-shaped member, and it is supported through the dicing tape 10 to a ring frame 14 in transferring the wafer W. A plurality of crossing division lines are formed on the front side of the wafer W to thereby define a plurality of separate regions where a plurality of devices 15 are formed. A notch 16 indicating a crystal orientation is formed on the outer circumference of the wafer W. The wafer W may be a semiconductor wafer composed of a semiconductor substrate and semiconductor devices formed on the semiconductor substrate or may be an optical device wafer composed of an inorganic material substrate and optical devices formed on the inorganic material substrate.

The dicing tape 10 has a function as a tape for dicing and a function as an adhesive for die bonding. The dicing tape 10 is composed of a base tape 11, an adhesive layer 12 formed on the base tape 11, and a DAF 13 formed on the adhesive layer 12. That is, the DAF 13 is stacked through the adhesive layer 12 on the base tape 11. The adhesive layer 12 is formed of ultraviolet curing resin curable by the application of ultraviolet light. Accordingly, by curing this resin, the DAF 13 can be easily separated from the base tape 11. The DAF 13 is separated from the adhesive layer 12 after dividing the wafer W into chips C (see FIG. 8) with the DAF 13 attached. The DAF 13 attached to each chip C functions as an adhesive in die bonding (mounting) of each chip C. Thus, the base tape 11 (dicing tape) and the DAF 13 are united together to form the dicing tape 10, so that an operation for attaching a DAF to the wafer W can be eliminated.

When the DAF 13 of the dicing tape 10 is attached to the back side of the wafer W, there is a possibility that bubbles B may be left between the attached surface of the DAF 13 and the back side of the wafer W due to scratch, dust, etc. present on the back side of the wafer W. Accordingly, in bonding each chip C (see FIG. 8) obtained by dividing the wafer W, there is a problem such that poor adhesion may be caused by the bubbles B left between the chip C and the DAF 13. To solve this problem, any position where the DAF 13 does not adhere to the wafer W is checked before bonding each chip C according to this preferred embodiment (see FIG. 4). Accordingly, the use of any chip C causing poor adhesion of the DAF 13 can be eliminated in advance to thereby avoid poor bonding and improve working efficiency.

Figure 2:
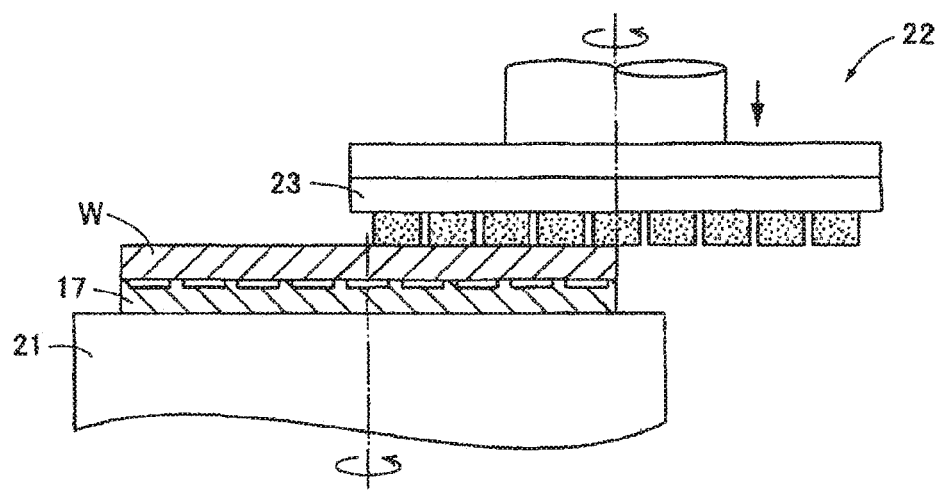
FIG. 2 is a sectional view, partly in side elevation, showing a grinding step in the first preferred embodiment.
Figure 4:
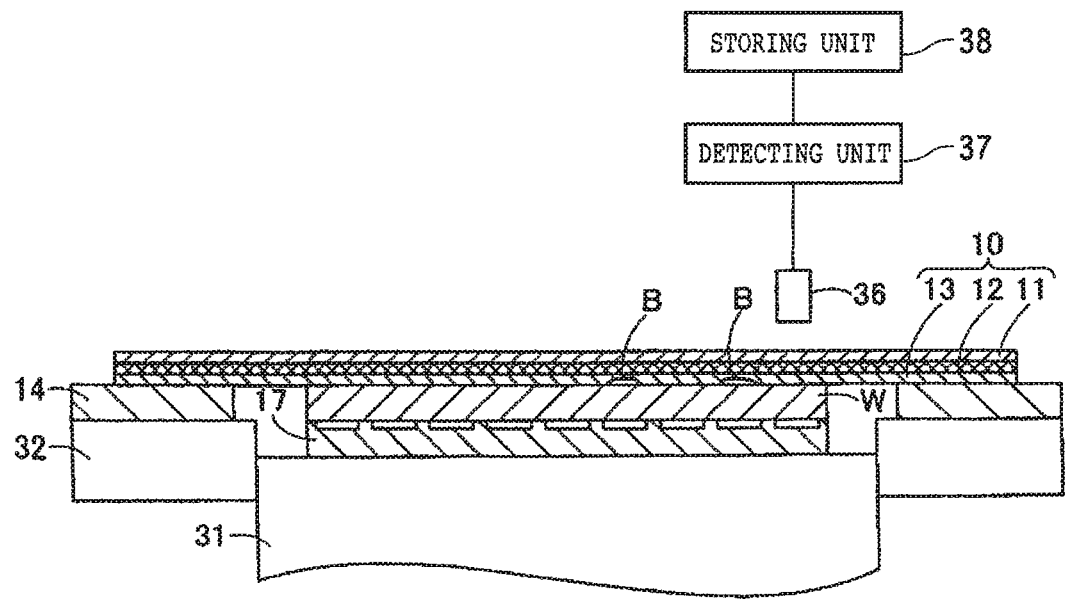
FIG. 4 is a sectional view showing a storing step in the first preferred embodiment.
Figure 5A:
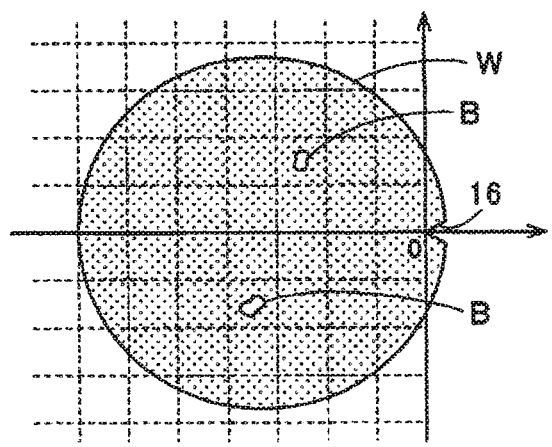
FIGS. 5A to 5C are schematic plan views showing a method of detecting the positions of poor adhesion of a DAF to the wafer in the first preferred embodiment.
Figure 5B:
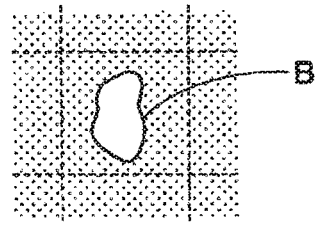
Figure 5C:
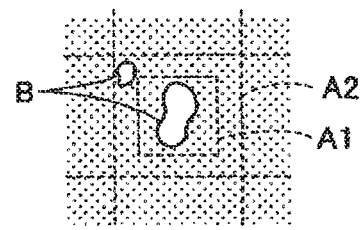
Figure 6:
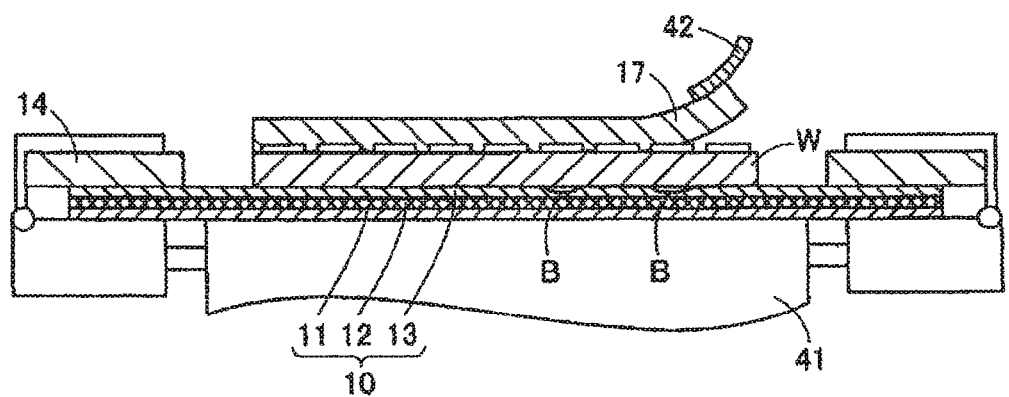
FIG. 6 is a sectional view showing a protective tape peeling step in the first preferred embodiment.
Figure 7:
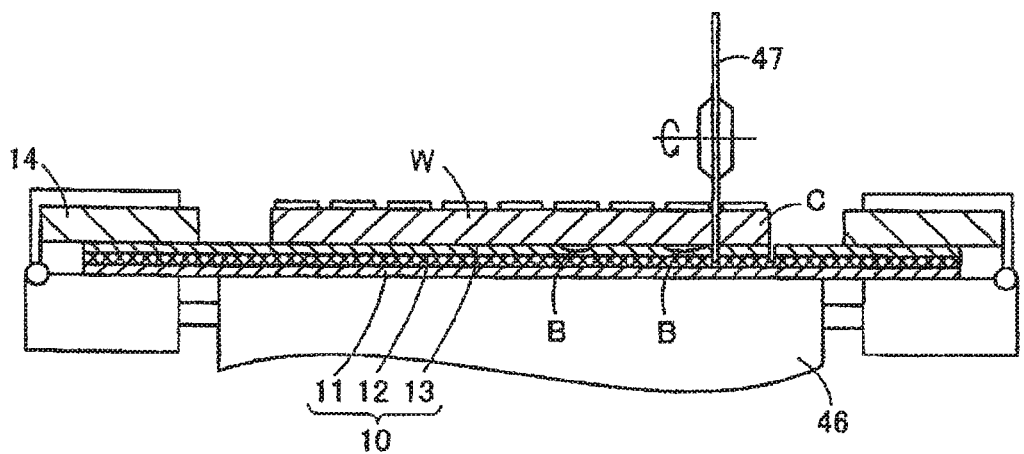
FIG. 7 is a sectional view showing a dividing step in the first preferred embodiment.
Figure 8:
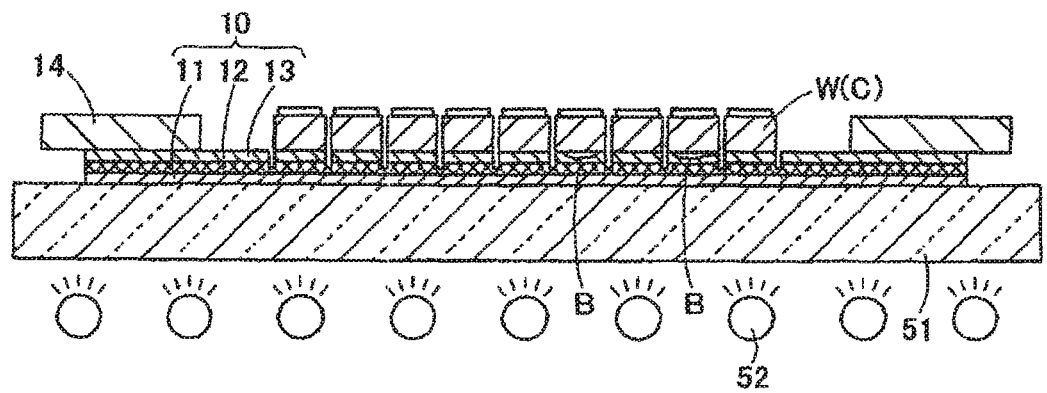
FIG. 8 is a sectional view showing an ultraviolet light applying step in the first preferred embodiment.
Figure 9:
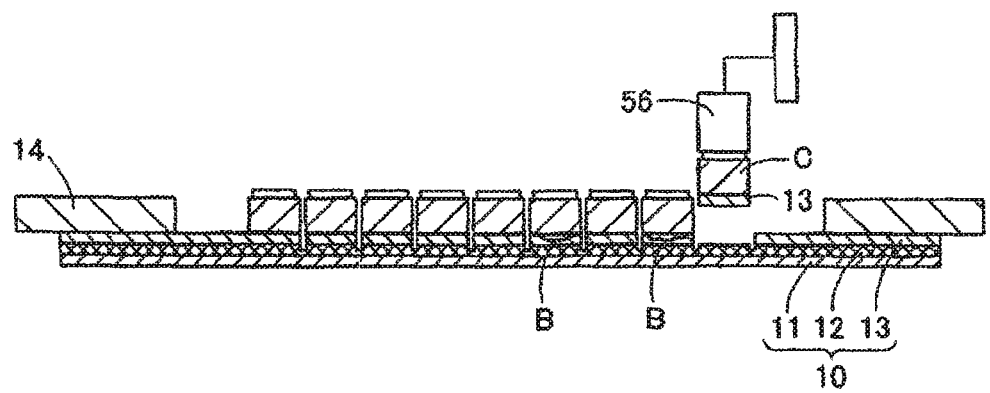
FIG. 9 is a sectional view showing a pickup step in the first preferred embodiment.

A wafer processing method according to the first preferred embodiment will now be described with reference to FIGS. 2 to 9. FIG. 2 is a sectional view showing a grinding step, FIG. 3 is a sectional view showing a tape attaching step, FIG. 4 is a sectional view showing a storing step, FIGS. 5A to 5C are schematic plan views showing a method of detecting the positions of poor adhesion, FIG. 6 is a sectional view showing a protective tape peeling step, FIG. 7 is a sectional view showing a dividing step, FIG. 8 is a sectional view showing an ultraviolet light applying step, and FIG. 9 is a sectional view showing a pickup step.

As shown in FIG. 2, the grinding step is first performed by using a grinding apparatus including a chuck table 21 and a grinding unit 22. In the grinding step, a protective tape 17 for protecting the devices is attached to the front side of the wafer W, and the protective tape 17 attached to the front side of the wafer W is held on the chuck table 21. In this condition, the grinding unit 22 is rotated and lowered toward the chuck table 21 until a grinding wheel 23 included in the grinding unit 22 comes into contact with the back side of the wafer W. Accordingly, the back side of the wafer W is ground by the grinding wheel 23 being rotated. During this grinding, the thickness of the wafer W is measured by a height gauge (not shown) in real time, and the grinding amount is adjusted so that the result of measurement by the height gauge approaches a target finished thickness.

The protective tape 17 has an adhesive layer formed of ultraviolet curing resin, through which the protective tape 17 is attached to the front side of the wafer W. After grinding the wafer W to reduce the thickness of the wafer W to the finished thickness, ultraviolet light is applied to the protective tape 17 to thereby cure the adhesive layer of the protective tape 17. In this manner, before attaching the dicing tape 10 to the wafer W, the adhesive layer of the protective tape 17 is cured to thereby facilitate the separation of the protective tape 17 from the wafer W. While the grinding step has been described above, a polishing step may be performed after performing the grinding step. Further, the grinding step may be composed of rough grinding and finish grinding for the wafer W.

Figure 3:
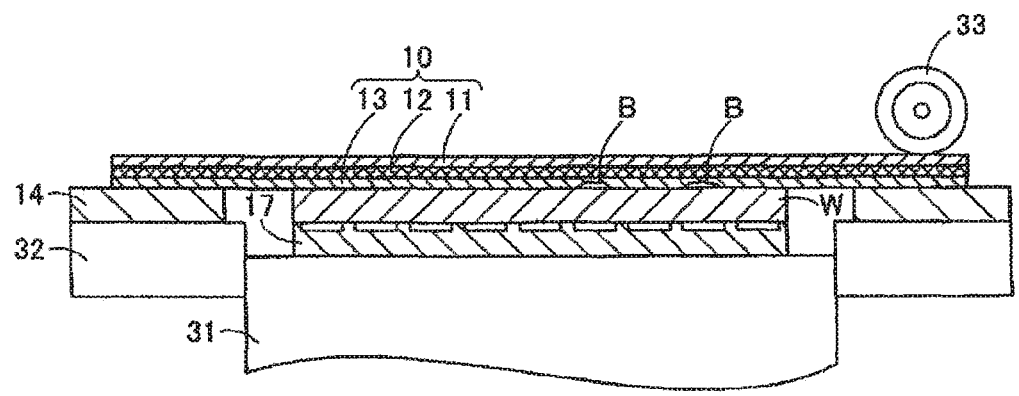
FIG. 3 is a sectional view showing a tape attaching step in the first preferred embodiment.

As shown in FIG. 3, the tape attaching step is performed after performing the grinding step, by using a tape attaching apparatus including a central table 31, a peripheral table 32 surrounding the central table 31, and a tape roller 33. In the tape attaching step, the protective tape 17 attached to the front side of the wafer W is placed on the central table 31, and the ring frame 14 is placed on the peripheral table 32. In this condition, the dicing tape 10 is attached to the back side of the wafer W and the back side of the ring frame 14 by using the tape roller 33. The tape attaching step is not limited to the method shown in FIG. 3, provided that the dicing tape 10 can be attached to the wafer W. For example, the tape attaching step may be manually performed by an operator.

As shown in FIG. 4, the storing step is performed after performing the tape attaching step, by using an image sensor 36, a detecting unit 37 connected to the image sensor 36, and a storing unit 38 connected to the detecting unit 37. In the storing step, the image sensor 36 is positioned above and near the wafer W held on the central table 31 of the tape attaching apparatus, thereby imaging the wafer W through the dicing tape 10. An image obtained by the image sensor 36 is output to the detecting unit 37. The detecting unit 37 then detects the positions of poor adhesion (bubbles B) where the DAF 13 does not adhere to the wafer W. Thereafter, the positions of poor adhesion thus detected by the detecting unit 37 are output to the storing unit 38 and then stored by the storing unit 38. Accordingly, it is determined whether or not each chip C (see FIG. 8) obtained by dividing the wafer W has the poor adhesion.

As shown in FIG. 5A, the poor adhesion of the DAF 13 (see FIG. 4) is caused by the intrusion of the bubbles B between the DAF 13 and the wafer W and appears as a white area on the image of the wafer W. In a coordinate system wherein the notch 16 of the wafer W is set at the origin, any pixel having a luminance greater than or equal to a predetermined luminance is searched to detect the coordinate position of the pixel in the white area. The storing unit 38 (see FIG. 4) preliminarily stores the correspondence between each pixel in the coordinate system and each chip C (see FIG. 8) obtained by dividing the wafer W. Accordingly, each pixel indicating the poor adhesion of the DAF 13 is stored into the storing unit 38 so as to be related to the corresponding chip C.

As a modification shown in FIG. 5B, the poor adhesion may be determined according to the size of each bubble B in the storing step. For example, when a predetermined number of or more pixels in one chip are white, the poor adhesion is determined, whereas when less than the predetermined number of pixels in one chip are white, it is determined that such a white area has no effect on adhesion and it is negligible. As another modification shown in FIG. 5C, the poor adhesion may be determined according to the position of each bubble B in the storing step. For example, when the pixels in a central area A1 in one chip are white, the poor adhesion is determined, whereas when the pixels in a peripheral area A2 in one chip are white, it is determined that the bubble B in the peripheral area A2 may be expelled in bonding the chip C and that such a white area is negligible as having no effect on adhesion.

As the image sensor 36 for imaging the wafer W, an area sensor having a plurality of imaging devices arranged in rows and columns may be used to image the whole surface of the wafer W from the upper side thereof. Alternatively, a line sensor having a plurality of imaging devices arranged in a line may be used as the image sensor 36. The line sensor has a length not less than the diameter of the wafer W. In this case, the line sensor and the wafer W are relatively scanned to image the whole surface of the wafer W. The wafer W may be imaged by any imaging apparatus capable of imaging the whole surface of the wafer W, rather than by the use of the image sensor 36.

For example, a photosensor (photoreflector) having a light applying portion and a light receiving portion may be used to image the wafer W in place of the image sensor 36. In this case, measuring light is applied from the light applying portion to the front side of the wafer W, and reflected light obtained by the reflection of the measuring light from the front side of the wafer W is received by the light receiving portion. The quantity of the reflected light from the wafer W is different from the quantity of the reflected light from the bubbles B. For example, the quantity of the reflected light from the bubbles B is larger than that from the wafer W, so that the photosensor is scanned relative to the wafer W and the position where the quantity of the reflected light has changed is then stored into the storing unit 38. In this method using the photosensor, any scanning means is required. However, the light quantity detected by the light receiving portion of the photosensor can be converted into data as voltage values, and processing can be performed faster than that in the case of using the image of the wafer W.

As shown in FIG. 6, the protective tape peeling step is performed after performing the storing step, by using a tape peeling apparatus including a chuck table 41 and a peeling tape 42. In the tape peeling step, the dicing tape 10 attached to the back side of the wafer W is held on the chuck table 41, so that the protective tape 17 is oriented upward. In this condition, the peeling tape 42 is attached to a part of the peripheral portion of the protective tape 17, and the protective tape 17 is peeled from the wafer W by pulling up the peeling tape 42. At this time, the adhesive layer (not shown) of the protective tape 17 is previously cured by the application of ultraviolet light to thereby reduce the adhesive force of the protective tape 17. Accordingly, the protective tape 17 can be easily peeled from the wafer W without separation of the wafer W from the dicing tape 10.

As shown in FIG. 7, the dividing step is performed after performing the tape peeling step, by using a cutting apparatus including a chuck table 46 and a cutting blade 47. In the dividing step, the wafer W is held through the dicing tape 10 on the chuck table 46. In this condition, the cutting blade 47 is positioned directly above the extension of a predetermined one of the division lines formed on the front side of the wafer W. Thereafter, the cutting blade 47 is rotated at a high speed and lowered to a height where the DAF 13 of the dicing tape 10 can also be cut. Thereafter, the chuck table 46 is moved relatively to the cutting blade 47 being rotated, thereby dividing the wafer W and the DAF 13 along the predetermined division line. This cutting operation is similarly performed along all of the other division lines to thereby divide the wafer W into individual chips C along all of the other division lines and also divide the DAF 13 along all of the other division lines.

Accordingly, the wafer W is divided into the individual chips C in the condition where the DAF 13 is attached to each chip C and each chip C with the DAF 13 remains attached to the base tape 11 of the dicing tape 10. This dividing step may be performed by any dividing apparatus capable of dividing the wafer W and the DAF 13 along each division line, rather than by the use of the cutting apparatus. For example, the dividing step may be performed by laser processing such that a laser beam is applied to the wafer W to form a modified layer as a division start point inside the wafer W along each division line, and an external force is next applied to the division start point by expanding the dicing tape, for example, thereby dividing the wafer W into the individual chips C. As a modification, the dividing step may be performed by ablation such that a laser beam is applied to the wafer W to form a laser processed groove on the wafer W along each division line, thereby dividing the wafer W into the individual chips C.

The modified layer is a region where the density, refractive index, mechanical strength, and any other physical properties of the wafer W have been made different from those in its ambient region by the application of a laser beam, so that the strength of the modified layer is lower than that of its ambient region. Examples of the modified layer include a melted region, cracked region, dielectric breakdown region, and refractive index changed region. These regions may be mixed. Further, the ablation is a phenomenon such that when the intensity of a laser beam applied becomes equal to or greater than a predetermined processing threshold, the energy of the laser beam is converted into electronic, thermal, photoscientific, and mechanical energy on the surface of a solid, so that neutral atoms, molecules, positive and negative ions, radicals, clusters, electrons, and light are explosively emitted and the solid surface is etched.

As shown in FIG. 8, the ultraviolet light applying step is performed after performing the dividing step, by using a support table 51 and an ultraviolet lamp 52 provided below the support table 51. The support table 51 is formed of a material such as glass capable of transmitting ultraviolet light. In the ultraviolet light applying step, the wafer W is supported through the dicing tape 10 on the support table 51. In this condition, ultraviolet light is applied from the ultraviolet lamp 52 to the dicing tape 10. As a result, the adhesive layer 12 between the base tape 11 and the DAF 13 of the dicing tape 10 is cured to reduce its adhesive force. Accordingly, the adhesive force of the DAF 13 to each chip C becomes greater than the adhesive force of the DAF 13 to the base tape 11, so that each chip C with the DAF 13 can be easily separated from the dicing tape 10.

As shown in FIG. 9, the pickup step is performed after performing the ultraviolet light applying step, by using a pickup apparatus having a suction nozzle 56. In the pickup step, the suction nozzle 56 is positioned above the individual chips C on the dicing tape 10. At this time, according to the positions of poor adhesion stored in the storing unit 38 (see FIG. 4), the chips C having the poor adhesion (bubbles B) of the DAF 13 are excluded and the other chips C with the DAF 13 well adhered are detected. Then, the suction nozzle 56 is positioned directly above one of the chips C with the DAF 13 well adhered. Thereafter, the suction nozzle 56 is operated to hold this chip C with the DAF 13 well adhered under suction and separate it at the boundary between the adhesive layer 12 and the DAF 13. Thus, the chip C with the DAF 13 well adhered is picked up by the suction nozzle 56. The other chips C with the DAF 13 well adhered are also similarly picked up by the suction nozzle 56.

According to the wafer processing method of the first preferred embodiment mentioned above, the dicing tape 10 having the DAF 13 and the adhesive layer 12 is attached to the back side of the wafer W, and the back side of the wafer W is imaged through the dicing tape 10 to detect the positions of poor adhesion where the DAF 13 does not adhere to the wafer W. The positions of poor adhesion detected above are stored into the storing unit 38. After dividing the wafer W and the DAF 13, only the chips C with the DAF 13 well adhered are separated at the boundary between the DAF 13 and the adhesive layer 12 and then picked up. Accordingly, there is no possibility that the chip C having the poor adhesion of the DAF 13 may be mounted to a substrate or the like, so that a chip mounting operation and the chips C mounted are not wasted, but the working efficiency can be improved.

While the poor adhesion of the DAF 13 is detected before dividing the wafer W in the first preferred embodiment, the present invention is not limited to this configuration. According to a second preferred embodiment of the present invention to be hereinafter described, the poor adhesion of the DAF 13 is detected after dividing the wafer W. In the second preferred embodiment, an expansion tape 70 with a DAF 73 is attached to the chips C obtained by dividing the wafer W, and the positions of poor adhesion between the DAF 73 and the chips C are detected (see FIG. 13). Not only the bubbles B, but also a breaking line 75 indicative of the spacing between any adjacent ones of the chips C appears as a white area on the image of the wafer W. To prevent erroneous recognition such that the breaking lines 75 may be recognized as the poor adhesion, the pixels indicating the breaking lines 75 are removed from the image and only the bubbles B indicating the poor adhesion are detected.

Figure 10:
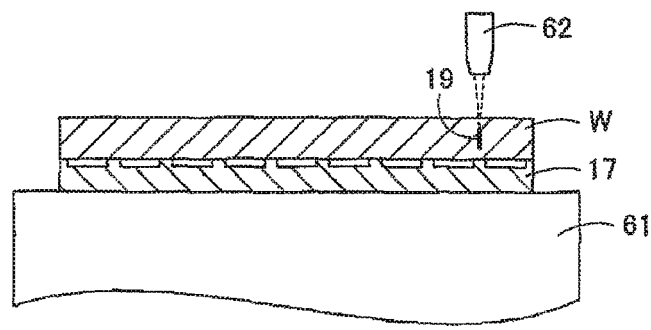
FIG. 10 is a sectional view showing a division start point forming step in a second preferred embodiment of the present invention.
Figure 11:
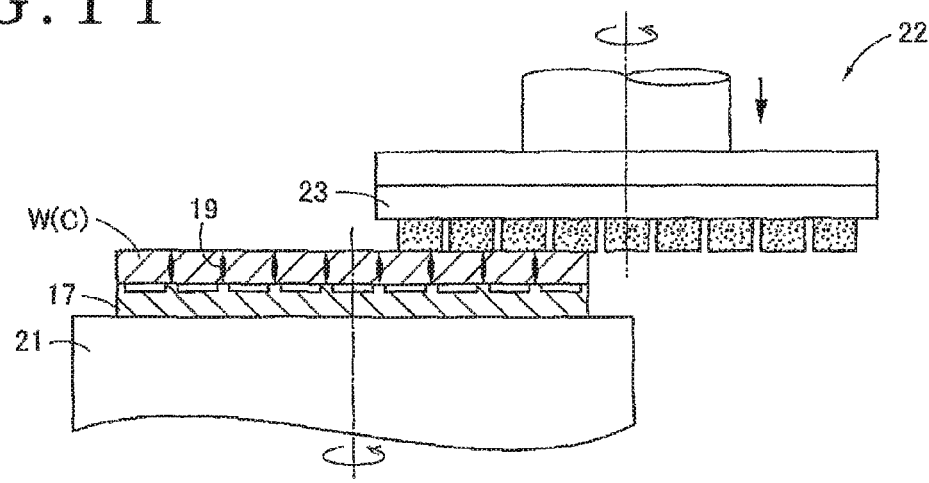
FIG. 11 is a sectional view, partly in side elevation, showing a wafer dividing step in the second preferred embodiment.
Figure 12:
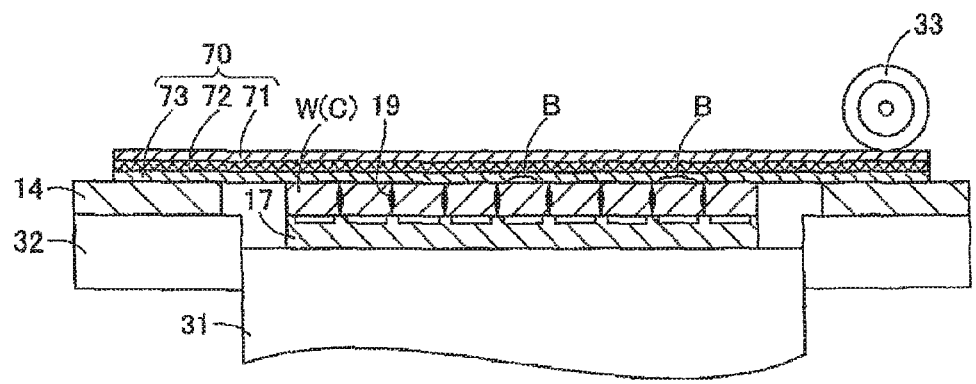
FIG. 12 is a sectional view showing a tape attaching step in the second preferred embodiment.
Figure 13:
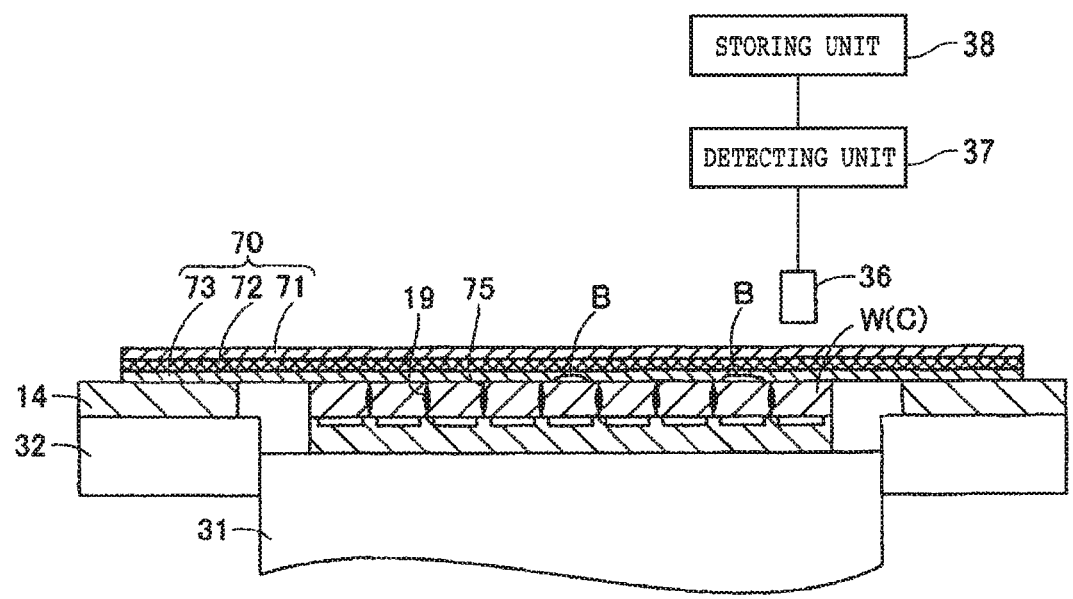
FIG. 13 is a sectional view showing a storing step in the second preferred embodiment.
Figure 14:
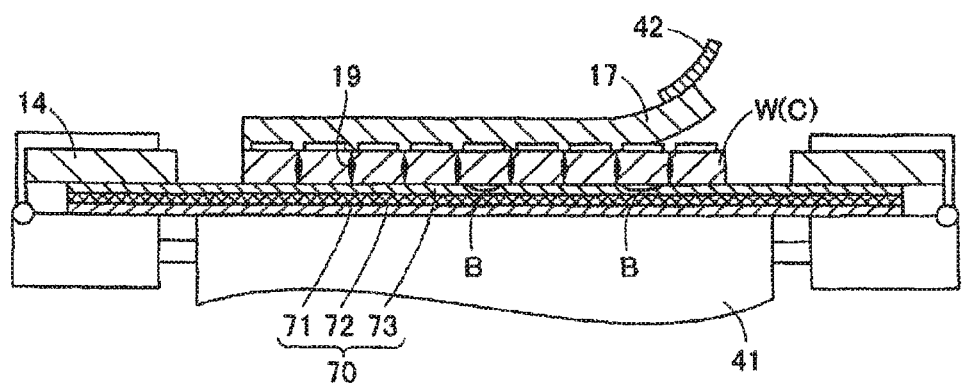
FIG. 14 is a sectional view showing a protective tape peeling step in the second preferred embodiment.
Figure 15:
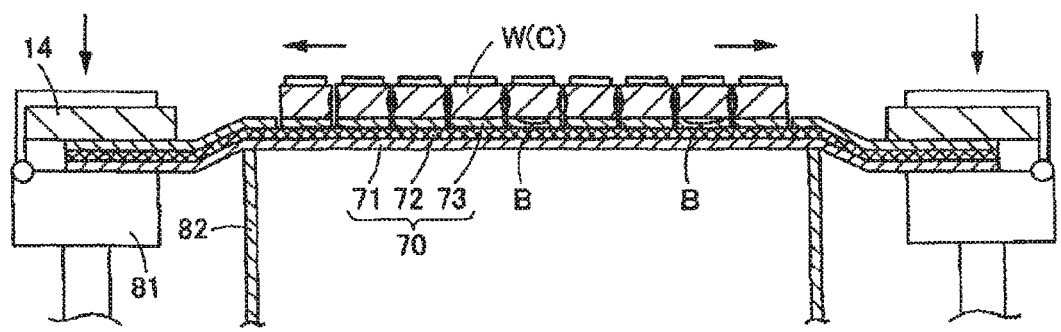
FIG. 15 is a sectional view showing a DAF dividing step in the second preferred embodiment.
Figure 16:
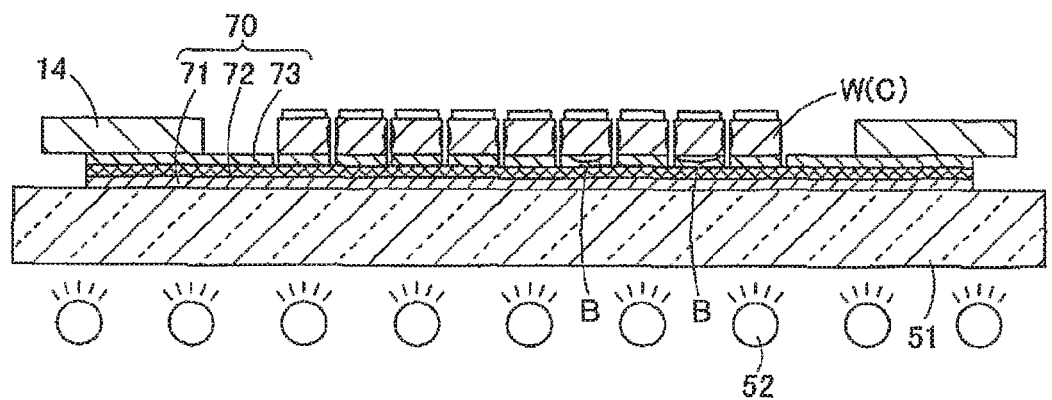
FIG. 16 is a sectional view showing an ultraviolet light applying step in the second preferred embodiment.
Figure 17:
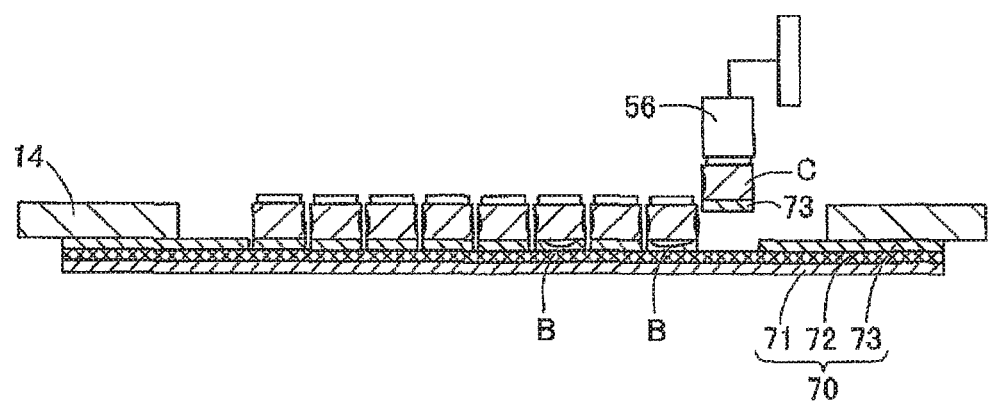
FIG. 17 is a sectional view showing a pickup step in the second preferred embodiment.

A wafer processing method according to the second preferred embodiment will now be described with reference to FIGS. 10 to 17. While the second preferred embodiment adopts stealth dicing before grinding (SDBG), the poor adhesion of the DAF may be similarly detected in the case of adopting dicing before grinding (DBG). FIG. 10 is a sectional view showing a division start point forming step, FIG. 11 is a sectional view showing a wafer dividing step, FIG. 12 is a sectional view showing a tape attaching step, FIG. 13 is a sectional view showing a storing step, FIG. 14 is a sectional view showing a protective tape peeling step, FIG. 15 is a sectional view showing a DAF dividing step, FIG. 16 is a sectional view showing an ultraviolet light applying step, and FIG. 17 is a sectional view showing a pickup step. In the following description, substantially the same parts as those of the first preferred embodiment are denoted by the same reference symbols and the description thereof will be minimized.

As shown in FIG. 10, the division start point forming step is first performed by using a laser processing apparatus including a chuck table 61 and a laser head 62. In the division start point forming step, the wafer W is held through a protective tape 17 on the chuck table 61. In this condition, the beam outlet of the laser head 62 is positioned directly above a predetermined one of the division lines of the wafer W, and a laser beam is applied from the laser head 62 to the back side of the wafer W in the condition where the focal point of the laser beam is set inside the wafer W. The laser beam has a transmission wavelength to the wafer W. In applying the laser beam to the wafer W, the laser head 62 is moved relative to the wafer W along the predetermined division line to thereby form a modified layer 19 as a division start point inside the wafer W along the predetermined division line. As a modification, the laser beam may be applied to the front side of the wafer W. This laser processing is similarly performed along all of the other division lines to form similar modified layers 19.

As shown in FIG. 11, the wafer dividing step is performed after performing the division start point forming step, by using a grinding apparatus including a chuck table 21 and a grinding unit 22. In the wafer dividing step, the wafer W is held through the protective tape 17 on the chuck table 21. In this condition, the grinding unit 22 is rotated and lowered toward the chuck table 21 until a grinding wheel 23 included in the grinding unit 22 comes into contact with the back side of the wafer W. Accordingly, the back side of the wafer W is ground by the grinding wheel 23 being rotated. By this grinding operation, a strong grinding load is applied from the grinding wheel 23 to the modified layers 19 formed inside the wafer W, so that the wafer W is divided along the modified layers 19 as the division start point to obtain individual chips C. During this grinding, the wafer W is ground until the result of measurement by a height gauge becomes a finished thickness.

Like the first preferred embodiment, the protective tape 17 is attached through an adhesive layer of ultraviolet curing resin to the front side of the wafer W. After grinding the wafer W, ultraviolet light is applied to the protective tape 17 to thereby cure the adhesive layer of the protective tape 17. In this manner, before attaching an expansion tape 70 (see FIG. 12) to the wafer W, the adhesive layer of the protective tape 17 is cured to thereby facilitate the separation of the protective tape 17 from the wafer W.

As shown in FIG. 12, the tape attaching step is performed after performing the wafer dividing step, by using a tape attaching apparatus including a central table 31, a peripheral table 32 surrounding the central table 31, and a tape roller 33. In the tape attaching step, the protective tape 17 attached to the front side of the wafer W is placed on the central table 31, and the ring frame 14 is placed on the peripheral table 32. In this condition, the expansion tape 70 is attached to the back side of the wafer W and the back side of the ring frame 14 by using the tape roller 33. The tape attaching step is not limited to the method shown in FIG. 12, provided that the expansion tape 70 can be attached to the wafer W. For example, the tape attaching step may be manually performed by an operator.

As described above, the wafer processing method of the second preferred embodiment employs the expansion tape 70 in place of the dicing tape 10 (see FIG. 1B) used in the first preferred embodiment. The expansion tape 70 has a function as a tape for expansion and a function as an adhesive for die bonding. The expansion tape 70 is composed of an expandable base tape 71, an adhesive layer 72 formed on the base tape 71, and a DAF 73 formed on the adhesive layer 72. That is, the DAF 73 is stacked through the adhesive layer 72 on the base tape 71. The adhesive layer 72 is formed of ultraviolet curing resin curable by the application of ultraviolet light. Accordingly, by curing this resin, the DAF 73 can be easily separated from the base tape 71. Since the base tape 71 (expansion tape) and the DAF 73 are united together to form the expansion tape 70, an operation for attaching a DAF to the wafer W can be eliminated.

As shown in FIG. 13, the storing step is performed after performing the tape attaching step, by using an image sensor 36, a detecting unit 37 connected to the image sensor 36, and a storing unit 38 connected to the detecting unit 37. In the storing step, the image sensor 36 is positioned above and near the wafer W held on the central table 31 of the tape attaching apparatus, thereby imaging the wafer W through the expansion tape 70. An image obtained by the image sensor 36 is output to the detecting unit 37. The detecting unit 37 then detects the positions of poor adhesion (bubbles B) where the DAF 73 does not adhere to the wafer W. At this time, the poor adhesion of the DAF 73 appears as a white area on the image of the wafer W. Further, each breaking line 75 indicating the spacing between any adjacent ones of the chips C obtained by the wafer dividing step shown in FIG. 11 also appears as a white area on the image of the wafer W.

To prevent that the breaking lines 75 may be erroneously recognized as the bubbles B, the detecting unit 37 removes the breaking lines 75 from the image and then detects the poor adhesion of the DAF 13 from only the bubbles B appearing as white pixels on the image. The positions of poor adhesion detected by the detecting unit 37 are output to the storing unit 38 and then stored by the storing unit 38. Accordingly, it is determined whether or not each chip C obtained by dividing the wafer W has the poor adhesion. Further, as in the first preferred embodiment, the poor adhesion may be determined according to the size of each bubble B (see FIG. 5B) or according to the position of each bubble B (see FIG. 5C).

As a method for removing the breaking lines 75 from the image, the positions of the breaking lines 75 may be calculated from the wafer size and the index amount previously set in the laser processing apparatus, and the breaking lines 75 may be removed from the image according to the result of this calculation. This method can be easily performed because the breaking lines 75 are removed by calculation. Further, an orientation flat or notch indicating the crystal orientation of the wafer is used to specify an X direction and a Y direction.

As another method for removing the breaking lines 75 from the image, the image may be subjected to filter processing, thereby extracting the breaking lines 75 to remove them from the image. For example, a differential filter or a Laplacian filter may be used to emphasize the outlines (edges) of the breaking lines 75 and the bubbles B, and the linear outlines may be removed as the breaking lines 75 from the image. Accordingly, not only when the shape of each chip C is rectangular, but also when the shape of each chip C is polygonal such as triangular, pentagonal, and hexagonal, the breaking lines 75 can be removed properly.

As another method for removing the breaking lines 75 from the image, the breaking lines 75 may be extracted according to luminance to thereby remove the breaking lines 75 from the image. In this method, a change in luminance in the X and Y directions in the image is graphed and the areas where the luminance is greater than or equal to a preset threshold are determined as the breaking lines 75 and the bubbles B. Furthermore, when the areas having the luminance greater than or equal to the preset threshold are arranged periodically (at substantially equal intervals), the areas are determined as the breaking lines 75, whereas when these areas are arranged at random positions, the areas are determined as the bubbles B. Although a change in luminance in the X direction and in the Y direction must be detected, a processing speed can be increased because only the luminance on the image is checked.

As the image sensor 36 for imaging the wafer W, an area sensor having a plurality of imaging devices arranged in rows and columns may be used to image the whole surface of the wafer W from the upper side thereof. Alternatively, a line sensor having a plurality of imaging devices arranged in a line may be used as the image sensor 36. The line sensor has a length not less than the diameter of the wafer W. In this case, the line sensor and the wafer W are relatively scanned to image the whole surface of the wafer W. The wafer W may be imaged by any imaging apparatus capable of imaging the whole surface of the wafer W, rather than by the use of the image sensor 36.

For example, a photosensor (photoreflector) having a light applying portion and a light receiving portion may be used to image the wafer W in place of the image sensor 36. In this case, measuring light is applied from the light applying portion to the front side of the wafer W, and reflected light obtained by the reflection of the measuring light from the front side of the wafer W is received by the light receiving portion. The quantity of the reflected light from the wafer W is different from the quantity of the reflected light from the bubbles B. For example, the quantity of the reflected light from the bubbles B is larger than that from the wafer W, so that the photosensor is scanned relative to the wafer W and the position where the quantity of the reflected light has changed is then stored into the storing unit 38. In this method using the photosensor, any scanning means is required. However, the light quantity detected by the light receiving portion of the photosensor can be converted into data as voltage values, processing can be performed faster than that in the case of using the image of the wafer W.

As shown in FIG. 14, the protective tape peeling step is performed after performing the storing step, by using a tape peeling apparatus including a chuck table 41 and a peeling tape 42. In the tape peeling step, the expansion tape 70 attached to the back side of the wafer W is held on the chuck table 41, so that the protective tape 17 is oriented upward. In this condition, the peeling tape 42 is attached to a part of the peripheral portion of the protective tape 17, and the protective tape 17 is peeled from the wafer W by pulling up the peeling tape 42. At this time, the adhesive layer (not shown) of the protective tape 17 is previously cured by the application of ultraviolet light to thereby reduce the adhesive force of the protective tape 17. Accordingly, the protective tape 17 can be easily peeled from the wafer W without separation of the wafer W from the expansion tape 70.

As shown in FIG. 15, the DAF dividing step is performed after performing the protective tape peeling step, by using an expanding apparatus including an annular table 81 and an expanding drum 82 provided inside the annular table 81. The annular table 81 is vertically movable. In the DAF dividing step, the ring frame 14 is held on the annular table 81, and the upper end of the expanding drum 82 is positioned directly below the annular area of the expansion tape 70 between the wafer W and the ring frame 14. In this condition, the annular table 81 is lowered to thereby lower the ring frame 14. As a result, the expanding drum 82 is raised relative to the annular table 81, thereby pushing up the expansion tape 70 and radially expanding the expansion tape 70. At this time, the expansion of an attached portion of the DAF 73 to the chips C is suppressed and the expansion of the other portion where the DAF 73 is not attached to the chips C is only allowed to be expanded and divided. That is, the DAF 73 is divided along each spacing between any adjacent ones of the chips C.

As shown in FIG. 16, the ultraviolet light applying step is performed after performing the DAF dividing step, by using a support table 51 and an ultraviolet lamp 52 provided below the support table 51. The support table 51 is formed of a material such as glass capable of transmitting ultraviolet light. In the ultraviolet light applying step, the wafer W is supported through the expansion tape 70 on the support table 51. In this condition, ultraviolet light is applied from the ultraviolet lamp 52 to the expansion tape 70. As a result, the adhesive layer 72 between the base tape 71 and the DAF 73 of the expansion tape 70 is cured to reduce its adhesive force. Accordingly, the adhesive force of the DAF 73 to each chip C becomes greater than the adhesive force of the DAF 73 to the base tape 71, so that each chip C with the DAF 73 can be easily separated from the expansion tape 70.

As shown in FIG. 17, the pickup step is performed after performing the ultraviolet light applying step, by using a pickup apparatus having a suction nozzle 56. In the pickup step, the suction nozzle 56 is positioned above the individual chips C on the expansion tape 70. At this time, according to the positions of poor adhesion stored in the storing unit 38 (see FIG. 13), the chips C having the poor adhesion (bubbles B) of the DAF 73 are excluded and the other chips C with the DAF 73 well adhered are detected. Then, the suction nozzle 56 is positioned directly above one of the chips C with the DAF 73 well adhered. Thereafter, the suction nozzle 56 is operated to hold the chip C with the DAF 73 well adhered under suction and separate it at the boundary between the adhesive layer 72 and the DAF 73. Thus, the chip C with the DAF 73 well adhered is picked up by the suction nozzle 56. The other chips C with the DAF 73 well adhered are also similarly picked up by the suction nozzle 56.

According to the wafer processing method of the second preferred embodiment mentioned above, the expansion tape 70 having the DAF 73 and the adhesive layer 72 is attached to the back side of the wafer W after dividing the wafer W, and the back side of the wafer W is imaged through the expansion tape 70 to remove each breaking line 75 formed between any adjacent ones of the chips C and also to detect the positions of poor adhesion where the DAF 73 does not adhere to the wafer W. The positions of poor adhesion detected above are stored into the storing unit 38. Accordingly, there is no possibility that each breaking line 75 may be erroneously recognized as poor adhesion, so that only the positions of poor adhesion (bubbles B) can be stored. After dividing the DAF 73, only the chips C with the DAF 73 well adhered are separated at the boundary between the DAF 73 and the adhesive layer 72 and then picked up. Accordingly, there is no possibility that the chip C having the poor adhesion of the DAF 73 may be mounted to a substrate or the like, so that a chip mounting operation and the chips mounted are not wasted, but the working efficiency can be improved.

The present invention is not limited to the above preferred embodiments, but various modifications may be made. In the above preferred embodiments, the size, shape, etc. shown in the attached drawings are merely illustrative and they may be suitably changed within the scope where the effect of the present invention can be exhibited. Further, various modifications may be made without departing from the scope of the object of the present invention.

For example, in the first and second preferred embodiments, each step may be performed by separate apparatuses or by the same apparatus. Further, in the first and second preferred embodiments, the order of the steps may be suitably changed, provided that only the chips with the DAF well adhered can be picked up in the pickup step.

As described above, the present invention has the effect that mounting of the chips having the poor adhesion of the DAF can be eliminated to thereby improve the working efficiency. In particular, the present invention is useful as a wafer processing method for dividing a wafer by blade dicing, SDBG, DBG, etc.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for processing a wafer having a plurality of devices, a front side of said wafer being partitioned by a plurality of crossing division lines to thereby define a plurality of separate regions where said devices are formed, said wafer processing method comprising:
  a tape attaching step of attaching a dicing tape to a back side of said wafer, said dicing tape having a die attach film and an adhesive layer curable by an application of ultraviolet light;
  a storing step of imaging said wafer through said dicing tape to obtain an image of said wafer after performing said tape attaching step, detecting positions of bubbles in the adhesive layer and determining from a size of the bubbles whether the effect of the bubbles on adhesion is negligible, and storing positions of bubbles determined to indicate poor adhesion where said die attach film does not adhere to said wafer, and storing the positions of poor adhesion detected above;
  a dividing step of dividing said wafer into individual chips along said division lines and also dividing said die attach film into pieces attached to said respective chips after performing said storing step;
  an ultraviolet light applying step of applying ultraviolet light to said dicing tape after performing said dividing step, thereby curing said adhesive layer to reduce its adhesive force; and
  a pickup step of selectively separating said chips with said die attach film well adhered, at a boundary between said adhesive layer and said die attach film according to the positions of poor adhesion stored in said storing step, after performing said ultraviolet light applying step, and next picking up said chips with said die attach film well adhered.

2. A wafer processing method for processing a wafer having a plurality of devices, a front side of said wafer being partitioned by a plurality of crossing division lines to thereby define a plurality of separate regions where said devices are formed, said wafer processing method comprising:
  a wafer dividing step of dividing said wafer into individual chips along said division lines;
  a tape attaching step of attaching an expansion tape to a back side of said wafer after performing said wafer dividing step, said expansion tape having a die attach film and an adhesive layer curable by an application of ultraviolet light;
  a storing step of imaging said wafer through said expansion tape to obtain an image of said wafer after performing said tape attaching step, removing a breaking line formed between any adjacent ones of said chips, from said image, detecting positions of bubbles in the adhesive layer and determining form a size of the bubbles whether the effect of the bubbles on adhesion is negligible, and storing positions of bubbles determined to indicate poor adhesion where said die attach film does not adhere to said wafer, from said image, and storing the positions of poor adhesion detected above;
  a die attach film dividing step of dividing said die attach film into pieces attached to said respective chips after performing said storing step;
  an ultraviolet light applying step of applying ultraviolet light to said expansion tape after performing said die attach film dividing step, thereby curing said adhesive layer to reduce its adhesive force; and
  a pickup step of selectively separating said chips with said die attach film well adhered, at a boundary between said adhesive layer and said die attach film according to the positions of poor adhesion stored in said storing step, after performing said ultraviolet light applying step, and next picking up said chips with said die attach film well adhered.

* * * * *

UNITED STATES PATENT AND TRADEMARK OFFICE
CERTIFICATE OF CORRECTION

PATENT NO. : 9,881,828 B2
APPLICATION NO. : 15/410886
DATED : January 30, 2018
INVENTOR(S) : Yoshida et al.

Page 1 of 1

It is certified that error appears in the above-identified patent and that said Letters Patent is hereby corrected as shown below:

In the Claims

Column 14, Line 18, delete "form" and insert --from--.

Signed and Sealed this
Tenth Day of April, 2018

Andrei Iancu
*Director of the United States Patent and Trademark Office*